United States Patent [19]

Samuelson et al.

[11] Patent Number: 4,692,557

[45] Date of Patent: Sep. 8, 1987

[54] ENCAPSULATED SOLAR CELL ASSEMBLAGE AND METHOD OF MAKING

[75] Inventors: Gay M. Samuelson, Tempe, Ariz.; David J. St. Clair, Houston, Tex.

[73] Assignee: Shell Oil Company, Houston, Tex.

[21] Appl. No.: 919,918

[22] Filed: Oct. 16, 1986

[51] Int. Cl.$^4$ .................. H01L 25/02; H01L 31/18; H01L 21/56

[52] U.S. Cl. .................. 136/251; 136/259; 156/285; 156/299; 437/211

[58] Field of Search .............. 136/251, 259; 29/572, 29/588; 156/182, 285, 292, 297, 299

[56] References Cited

U.S. PATENT DOCUMENTS

| | | | |
|---|---|---|---|
| 3,595,942 | 7/1971 | Wald et al. | 525/332.9 |
| 3,957,537 | 5/1976 | Baskett et al. | 136/251 |
| 3,984,369 | 10/1976 | Harlad, Jr. et al. | 524/114 |
| 4,067,764 | 1/1978 | Walker et al. | 156/267 |
| 4,101,482 | 7/1978 | Doss et al. | 524/426 |
| 4,101,483 | 7/1978 | Moskal | 524/106 |
| 4,101,484 | 7/1978 | Doss | 524/271 |
| 4,207,359 | 6/1980 | Hanson et al. | 427/195 |
| 4,249,958 | 2/1981 | Baudin et al. | 136/251 |
| 4,262,161 | 4/1981 | Carey | 136/256 |
| 4,296,008 | 10/1981 | St. Clair et al. | 524/271 |
| 4,321,418 | 3/1982 | Dran et al. | 136/251 |
| 4,383,129 | 5/1983 | Gupta et al. | 136/251 |
| 4,401,839 | 8/1983 | Pyle | 136/251 |
| 4,499,658 | 2/1985 | Lewis | 29/588 |
| 4,542,257 | 9/1985 | Fraser et al. | 136/251 |
| 4,549,033 | 10/1985 | Avenel et al. | 136/251 |
| 4,636,578 | 1/1987 | Feinberg | 136/251 |

OTHER PUBLICATIONS

G. Samuelson et al., *Conf. Record*, 18th *IEEE Photovoltaic Specialists Conf.*, (1985), Published Apr. 1986, pp. 1036-1040.

*Primary Examiner*—Aaron Weisstuch
*Attorney, Agent, or Firm*—Wendy K. B. Buskop

[57] ABSTRACT

A solar cell assemblage and method of making, comprising:
(a) a pre-treated silanized transparent substrate;
(b) a layer of semiconductor material;
(c) an electrical contact on the surface of said layer of semiconductor material;
(d) an extruded transparent film encapsulating the assemblage which comprises 75 to 91 parts by weight of a blend of:
65 to 75 parts by weight of a selectively hydrogenated two-block polymer wherein
(1) each A is a polymer block of a monovinyl or alpha alkyl monovinyl arene and the A blocks are from 10 to 40% by weight of the total block copolymer, and
(2) each B is a polymer block formed by polymerizing a conjugated diene, and the B blocks are 90 to 60% weight of the total block copolymer, and
25 to 35 parts by weight of a selectively hydrogenated multiblock copolymer wherein:
(1) each A is a polymer endblock of a monovinyl or alpha alkyl monovinyl arene and the A blocks are 10 to 40% by weight of the total block copolymer, and
(2) each B is a polymer midblock is formed by polymerizing a conjugated diene and the B blocks are 90 to 10% weight of the total block copolymer,
about 8.5 to about 23.5 parts by weight of an (alpha) methyl styrene polymer tackifying resin; and
about 0.5 to about 1.5 parts by weight of a mixture of a phenolic antioxidant, a UV absorber with benzotriazole functionality and a UV absorber with hindered amine functionality;
(e) a carbon filled polymer frame; and
(f) sealant.

28 Claims, 10 Drawing Figures

ENCAPSULATED SOLAR CELL ASSEMBLAGE AND METHOD OF MAKING

FIELD OF THE INVENTION

This invention relates generally to a novel encapsulated solar cell assemblage and method for making an encapsulated solar cell assemblage with an elastomeric, transparent, cohesive, thin, heat sealable, extrudable film.

BACKGROUND OF THE INVENTION

Traditionally, solar cells have had difficulty in enduring extended exposure to weather elements, such as rain, snow, sleet, hail, and heat. Many attempts have been made to extend the life of solar cells by covering a solar cell or string of solar cells in anti-reflection or index-matching layers and by encasing a solar cell or string of solar cells in water resistant and weather impervious encapsulants.

U.S. Pat. No. 4,262,161 discloses a solar cell assemblage prepared using a transparent film comprised of a block copolymer having at least two monoalkenyl arene polymer end blocks A and at least one polymer mid block B selected from the group consisting of substantially completely hydrogenated conjugated diene polymer blocks, ethylenepropylene polymer blocks, and ethylene-butene polymer blocks between the cover plate and the electrical contact of the solar cell.

Even though this film provides good weather resistance for the resultant solar cell assemblage, it has been long desired to develop a novel film for use in solar cell assemblages which (1) is transparent to sunlight; (2) resistant to ultraviolet degradation; (3) has a refractive index intermediate that of glass and an anti-reflection coating on the solar cell; (4) has low water absorption/permeation properties; (5) acts as an electrical insulator; (6) is heat sealable; (7) has a wide service temperature range, preferably from about −40° C. to about 90° C.; (8) has good adhesion, giving a peel strength of up to 40 pounds per inch with cohesive failure, and (9) can be extruded or curtain coated onto suitably prepared glass or silicone-based substrates.

Known films used in solar cell assemblages have had a specific disadvantage; they have been highly susceptible to delamination because they have had low peel strength, in the range of less than 10 pounds per inch, with adhesive failure. A need has long existed to prepare a solar cell with a film capable of achieving a peel strength of over 10 pounds per inch with cohesive, not adhesive, failure.

While polyvinylbutyral (PVB) and polyethylene/vinylacetate (EVA) are the present encapsulants which are standard in the photovoltaic industry, they are not ideal candidates. PVB is hygroscopic and thus requires careful control of temperature and humidity during storage and conditioning and during sheeting operations in a manufacturing environment. Failure to control the atmosphere results in poor laminations due to voids formed from outgassing of absorbed water. The moisture sensitivity of PVB also dictates the use of a metal foil backskin which is unacceptable in several product specifications. EVA, on the other hand, has a requirement for peroxide catalyzed crosslinking to achieve creep resistance, a fact that presents several concerns. Since the peroxide in the film is relatively volatile, its concentration in the film in free sheet form, which determines the ultimate level of crosslinking, can vary as described in I. E. du Pont de Nemours & Co., Technical Guide, Elvax 150 EVA-Solar Photovoltaic Module Pottant, J. D. Pomije. Thus, the degree of crosslinking can vary and there is no good test of this parameter in an in-line production process. A second concern is that the time to achieve sufficient crosslinking is not consistent with a high throughput production lamination cycle time. Thirdly, while peroxide is volatile in free-standing film, it is not so volatile that all unused peroxide is removed during lamination, which could compromise the longevity of some module components.

The problems alluded to have led to the search for an alternative pottant that is not only easily controlled in a high throughput manufacturing setting, but is at least as reliable as PVB and EVA.

U.S. Pat. No. 3,984,369 discloses a composition which could be used as a sealant and which has good substrate/sealant adhesion, good UV stability, good peel strength in tests against glass, and useful hardness, tensile, and flexibility properties. This novel sealant comprises:

(a) about 3 to 30 percent by weight of an elastomeric ABA type poly($\alpha$-monoalkenyl arene)/hydrogenated poly(conjugated diene) block copolymer having at least two poly($\alpha$-monoalkenyl arene) A blocks wherein the average molecular weight of the arene blocks is 4,000 to 50,000; the average molecular weight of the poly(conjugated diene) B block is 18,000 to 250,000; the conjugated diene block contains at least 20% 1,2 bonds prior to hydrogenation; and at least 98% of the double bonds present in the conjugated diene blocks are saturated during hydrogenation;

(b) about 2 to 40 percent by weight of butyl rubber;

(c) about 1 to about 70 percent by weight of an oil having a solubility parameter of from about 6 to about 8;

(d) about 1 to about 50 percent by weight of an adhesion promoting resin having a solubility parameter of from about 8 to about 12;

(e) about 0 to about 70 percent by weight of an inorganic filler; and (f) about 0.01 to about 2.0 percent by weight of an oxidation stabilizer.

Even though this composition has good UV stability and does not undergo covalent crosslinking, the adhesion of the compositions containing little or no butyl rubber was poor, giving only low peel strength and failing by the undesirable adhesive failure mechanism. The reason for this is that the ABA type polymers are very strong, making it impossible to achieve a composition which will fail by the desired cohesive failure mechanism. Compositions based on an ABA type polymer can be quite high in viscosity, making them difficult to extrusion coat onto a substrate. An alternative method of applying these high viscosity compositions is to mix the composition in an extruder, grind it to form a powder, apply it to the desired object, and then heat fuse the powder onto the object forming an encapsulant coating. One such process is described in U.S. Pat. No. 4,207,369.

Another novel composition, taught in U.S. Pat. No. 4,296,008, involved a sealant composition with improved adhesion and melt flow properties based on the lower strength and lower viscosity A'B'/ABA type block polymer. This second sealant composition was taught which comprises:

(a) 100 parts by weight of a selectively hydrogenated block copolymer component comprising an A'B' block copolymer and an ABA type multiblock copolymer having at least two end blocks A and at least one mid block B wherein the A' and A blocks are monoalkenyl arene polymer blocks and the B' and B blocks are substantially completely hydrogenated conjugated diene polymer blocks, the number average molecular weight of the A' and A blocks are between about 3,000 and about 7,000 and the monoalkenyl arene content of the multiblock copolymer is between about 7% and about 22% by weight, wherein the weight ratio between the A'B' block copolymer and the ABA type multiblock copolymer is from about 20:80 to about 60:40;

(b) about 50 to about 350 parts by weight of a tackifying resin compatible with block B;

(c) about 0 to about 100 parts by weight of a plasticizer; and (d) about 0.1 to about 10 parts by weight of a silane coupling agent.

To insure good adhesion between a pottant based on an ABA type block copolymer and a substrate, the pottant must contain an adhesion promoting tackifying resin. To maintain good adhesion and impact resistance in the solar cell at low temperatures, the pottant must have a low glass transition temperature (Tg). The Tg of the hydrogenated polybutadiene B block of the block copolymer is $-58°$ C. by differential scanning calorimetry (DSC). The Tg of a typical 95° C. softening point tackifying resin is about 45° C. The Tg of the pottant comprised of a blend of ABA type block copolymer and tackifying resin will be intermediate between the Tg's of the polymer and the resin and will depend on the relative proportions of polymer and resin in the blend. If it is necessary to maintain low Tg in the pottant (e.g. $-30°$ C.), only a limited amount of the high Tg resin can be included in the composition. The relatively high percentage of ABA type block copolymer required in the composition to insure low Tg causes the melt viscosity of the pottant to be very high, making it difficult to extrusion coat the pottant onto a substrate.

To overcome this problem of high viscosity, it was discovered that the block copolymer used in the pottant must be of the ABA/A'B' type. The A'B' type diblock copolymers have much lower melt viscosity than do the ABA type multiblock copolymers. It was found that by using a block copolymer containing about a 30/70 ratio of ABA/A'B' block copolymers, a pottant could be made containing a limited amount of tackifying resin which had good adhesion and low Tg and which could be readily extrusion coated onto a substrate. Even though the novel composition could be extruded and applied to a variety of substrates such as glass or silicone release coated paper, the discovery of this novel composition was not enough to enhance the development of solar cells in general.

A silane treatment was developed to be used in combination with this novel extrudable pottant composition. The development of a silanization procedure that adequately promoted the adhesion of this novel composition to substrates in solar cells through prolonged humidity and freezing cycles was a critical discovery in the solar cell art. This discovery resulted in a method for preparing solar cells with improved durability.

A durable, mass-producible and cost-effective solar cell assemblage has long been sought. To develop such an array, a durable, mass-producible and cost-effective polymer frame has been developed. It is desirable to have as this frame, a thin, elastomeric, cohesive film that is highly flexible at low and high temperatures as well as being heat sealable.

More specifically, a polymeric encapsulant has long been needed for solar cells which is capable of the following traits:

(a) reducing manufacturing costs as compared to current polymer frames;

(b) providing support structure for corner mounting of arrays with estimated minimum material properties of a 60° C. modulus of $\sim 500,000$ psi;

(c) passing all UL and JPL test specifications including:
  1. thermal cycle
  2. humidity freeze cycle
  3. mechanical loading
  4. twisted-mounting surface
  5. hail-impact test procedures (d) having side rail bow of no more than $\frac{1}{8}''$ in any direction;

(e) sustaining adhesion to a substrate when subjected to pull of twice the module weight;

(f) enduring up to 30 years of North American weather with less than 5% loss in mechanical properties and maintaining UV stability for an "acceptable" appearance;

(g) maintaining a moisture barrier of edge seal at the substrate surface of less than 0.003 metric per cm;

(h) providing a weight comparable to an extant aluminum frame;

(i) having utility in a production environment;

(j) having intra-array wiring molded into the walls of the frame;

(k) having Class A residential housing flammability resistance;

(l) capable of sustaining a single mounting position at the center of a solar array;

(m) having a lighter weight than current frame systems; and (n) providing electrical insulation.

The present inventive solar cell assemblage was intended to provide a solar cell assemblage with a polymeric encapsulant which can be thermoset and injection molded. An object of the instant invention was to support a commercial 40 watt solar cell module supported at 4 mounting points molded into the polymeric encapsulant without any center mounting. Another object of the instant invention was to provide a polymeric encapsulant with panels of a thickness between about $0.210'' \pm 0.020''$. Yet another object of the present invention was to provide a polymeric encapsulant capable of containing intra-panel wiring harnesses. It was also an object of the invention to provide a solar cell assemblage capable of supporting a protective outer coating, such as a gel coat which improves a polymeric encapsulant's weatherability. It was an object of the present invention to provide polymeric encapsulants having a maximum mold temperature of about 90° C. and a button-to-button cycle time of less than 10 minutes.

TERMS

Various terms of art in the solar cell field will be utilized throughout this specification. What follows is a set of exemplary definitions for these terms commonly used in the art.

The term "pottant" refers to a transparent elastomer that encapsulates solar cell arrays, providing impact resistance, dielectric insulation, and optical coupling between glass and solar cells.

The term "backskin" refers to the laminate or single material that serves as a weatherable member on the backside of the solar cell array.

The phrase "solar cell string (or strings)" refers to the structure resulting from interconnecting solar cells in a series configuration using conducting tabs, straps, wires, or meshes.

The phrase "lay-up fixture" refers to the structure used to interconnect solar cell strings into an array capable of delivering the desired power.

The term "semiconductor material" refers to polycrystalline silicon with conducting properties intermediate between that of a metal and an insulator.

The term "silanized substrates" refers to a substrate which has been pretreated with a silane washing solution.

SUMMARY OF THE INVENTION

The invention includes:
(I) a solar cell assemblage comprising:
  (a) a pre-treated silanized transparent substrate;
  (b) a layer of semiconductor material;
  (c) an electrical contact on the surface of said layer of semiconductor material;
  (d) an extruded transparent film encapsulating the assemblage comprising (a), (b) and (c), said film comprising about 75 to 91 parts by weight of a blend of:
    about 65 to about 75 parts by weight of a selectively hydrogenated two-block polymer wherein one polymer block is designated by A and a second polymer block is designated by B such that prior to hydrogenation,
      (1) each A is a polymer block of a monovinyl or alpha alkyl monovinyl arene having a number average molecular weight in the range of from about 5,000 to about 75,000, said A blocks comprising from about 10 to about 40% by weight of the total block copolymer, and
      (2) each B is a polymer block having a number average molecular weight in the range of from about 10,000 to about 150,000 and is formed by polymerizing a conjugated diene having from 4 to 10 carbon atoms per molecule, and said B blocks comprising from about 90 to about 60% by weight of the total block copolymer, and
    about 25 to about 35 parts by weight of a selectively hydrogenated multiblock copolymer which contains at least two kinds of polymer blocks wherein one polymer block is designated by A and a second polymer block is designated by B such that:
      (1) each A is a polymer endblock of a monovinyl or alpha alkyl monovinyl arene having a number average molecular weight in the range of from about 5,000 to about 75,000,said A blocks comprising from about 10 to about 40% by weight of the total block copolymer, and
      (2) each B is a polymer midblock having a number average molecular weight in the range of from about 10,000 to about 150,000 and is formed by polymerizing a conjugated diene having from 4 to 10 carbon atoms per molecule, and said B blocks comprising from about 90 to about 10% weight of the total block copolymer,
    about 8.5 to about 23.5 parts by weight of an (alpha) methyl styrene polymer tackifying resin; and
    about 0.5 to about 1.5 parts by weight of a mixture of a phenolic antioxidant, a UV absorber with benzotriazole functionality, and a UV absorber with hindered amine functionality;
  (e) a carbon filled polymer frame to contain said encapsulated solar cell laminate; and
  (f) sealant to seal the frame to the solar cell laminate; and
(II) a method for making a solar cell assemblage comprising:
  (a) silanizing a substrate thereby forming a silanized substrate;
  (b) extrusion coating one side of said silanized substrate with a first thin extruded coherent film, thereby forming a coated substrate, said first film consisting essentially of:
    (1) about 78.5 to about 89.5 parts by weight of a blend of:
      (a) about 65 to about 75 parts by weight of a selectively hydrogenated two-block polymer wherein one polymer block is designated by A and a second polymer block is designated by B such that prior to hydrogenation,
        (1) each A is a polymer block of a monovinyl or alpha alkyl monovinyl arene having a number average molecular weight in the range of from about 5,000 to about 75,000, said A blocks comprising from about 10 to about 40% by weight of the total block copolymer, and
        (2) each B is a polymer block having a number average molecular weight in the range of from about 10,000 to about 150,000 and is formed by polymerizing a conjugated diene having from 4 to 10 carbon atoms per molecule, and said B blocks comprising from about 90 to about 60% weight of the total block copolymer, and
      (b) about 25 to about 35 parts by weight of a selectively hydrogenated multiblock copolymer which contains at least two kinds of polymer blocks wherein one polymer block is designated by A and a second polymer block is designated by B such that:
        (1) each A is a polymer endblock of a monovinyl or alpha alkyl monovinyl arene having a number average molecular weight in the range of from about 5,000 to about 75,000, said A blocks comprising from about 10 to about 40% by weight of the total block copolymer, and
        (2) each B is a polymer midblock having a number average molecular weight in the range of from about 10,000 to about 150,000 and is formed by polymerizing a conjugated diene having from 4 to 10 carbon atoms per molecule, and said B blocks comprising from about 90 to about 10% weight of the total block copolymer, and
    (2) about 10 to about 20 parts by weight of a hydrogenated (alpha)-methyl styrene polymer resin;
    (3) about 0.5 to about 1.5 parts by weight of a mixture of a phenolic antioxidant, a UV absorber with benzotriazole functionality, and a UV absorber with hindered amine functionality;
  (c) extrusion coating a backskin on the other side of said silanized substrate;
  (d) disposing on said coated substrate a layer of semiconductor material;

(e) disposing an electrical contact on the surface of said semiconductor material;

(f) coating said electrical contact with a second thin extruded coherent film consisting essentially of the same blend composition as the first film and forming an assemblage;

(g) disposing a cover on said assemblage;

(h) applying a vacuum to the assemblage thereby forming a pressure gradient between said substrate and said films, and thereby vacuum laminating the assemblage;

(i) heating said vacuum laminated assemblage to a temperature greater than the softening point of said first and second films and less than the melting point of solder and thereby heat sealing said assemblage;

(j) disposing said heat sealed assemblage in a carbon-filled frame; and (k) sealing said frame with an essentially rubber-type sealant and thereby forming a durable solar cell array.

DESCRIPTION OF THE PREFERRED EMBODIMENTS

The present invention involves a solar cell assemblage and a method of making a novel solar cell laminate using an extruded, heat sealable, elastomeric film.

The inventive solar cell laminate is constructed by first preparing the novel elastomeric film. The novel film can be prepared by any one of three teachings, solvent casting, film extrusion, and hot-melt casting.

The novel film is based on a 30% coupled Kraton ® G polymer, available commercially from the Shell Chemical Company, of Houston, Texas. This polymer is a novel thermoplastic block copolymer which has elastic and resilient properties similar to vulcanized rubber.

The thermoplastic block copolymers useful in the present invention which utilizes extrudable films capable of heat sealing are known as SBS or SEBS copolymers. SBS copolymers generally are polystyrene-polybutadiene-polystyrene copolymers. SEBS copolymers are generally polystyrene-poly(ethylene/butylene)-polystyrene copolymers. Thermoplastic copolymers of this type are well known in the art. For example, U.S. Pat. No. 3,595,942 describes typical SBS polymers as well as suitable hydrogenation methods for hydrogenating these copolymers. The structure of the copolymers is generally determined by their method of polymerization.

The use of hydrogenated and non-hydrogenated thermoplastic copolymers in sealants has been demonstrated. See, U.S. Pat. No. 4,101,482 which describes the use of hydrogenated theremoplastic copolymers and U.S. Pat. Nos. 4,101,482, 4,101,483, and 4,101,484 which describe sealants made with non-hydrogenated styrene-diene copolymers. These known sealant compositions have not provided the balance of adhesion, stability, and processability currently desired for the present end use.

One novel, heat sealable, extrudable, coherent film, particularly usable in the preparation of solar cells and solar cell strings, has the following composition:

TABLE 1

| Ingredient | Composition of Exp. Film parts by weight |
|---|---|
| Novel copolymer | 78.7 |
| Tackifying resin | 19.7 |
| Antioxidant | 1.0 |
| UV absorber with benzotriazole functionality | 0.3 |
| UV absorber with hindered amine functionality | 0.3 |

The copolymer in the preferred embodiment is Kraton ® G 1726, which contains 30% by weight of SEBS copolymer and 70% by weight of an SEB copolymer. In the most preferred embodiment, the SEB copolymer is about half the molecular weight of the SEBS copolymer. Kraton ® G 1726 is a product of the Shell Chemical Company, Houston, Tex.

The tackifing resin of the preferred embodiment is Regalrez ®0 1094, which is a hydrogenated α-methyl styrene polymer which is added to tackify the formulation while providing good UV and oxidative stability. Regalrez 1094 is a product of Hercules, Inc. of Wilmington, Del. Arkon P85 is an alternative tackifying resin which is usable within the scope of the invention and this resin is available from ARAKAWA Chemical Company, of Japan.

The preferred antioxidant is one which has hindered phenolic functionality. Preferably, it is a tetrakis[methylene 3,5-di-terbutyl-4-hydroxy hydrocinnamate]methane, such as Irganox ® 1010, made by Ciba-Geigy.

A preferred UV stabilizer package is one containing two components, 2(2′-hydroxy-5′-methyl phenyl)benzotriazole, such as Tinuvin ® 327, and a hindered amine light stabilizer, such as Tinuvin 770. Both Tinuvin 327 and Tinuvin 770 are products of Ciba-Geigy.

The film is prepared by feeding the individual components of Table 1 into a twin screw extruder to achieve blending and eliminate tacking which is usually associated with pre-blending of these types of elements. The mixture can be heated and pumped through a die. A typical die would be 18 inch (457 mm) in width. Once through the die, the extruded material can be passed onto chilled rollers, and then wound onto silicone release paper. Alternatively, the material can be pumped directly onto a silanized substrate, silicone coated release paper, or a polymeric laminate. It is preferred the film can be between about 15 and 20 mils thick.

The present invention was developed to provide a novel film composition capable of being extrusion applied to glass or to silicone release coated substrates to be wound up on take-up rolls and later used for preparing solar cell laminates. Other substrates which can be used within the scope of this invention include polymethylacrylate, polyvinylfluoride and polycarbonate.

With these advantages, the novel film has utility for use in solar cell assemblage preparation.

It was further discovered that the adhesion of this novel film to the glass substrate used in solar cell laminates could be enhanced by pretreating the glass with a silane pretreatment procedure. This silanization procedure enables good adhesion of the novel film to the substrate, adhesion which can sustain a greater than 10 pounds per inch peel strength under prolonged exposure to humidity. Substrates which can be pretreated with this novel silanization process can include glass, aluminum, steel, or any material that contains surface hydroxyl groups.

The silanes which can be used in the washing process are Union Carbide A-189, mercaptopropyltrimethoxy silane, Union Carbide A-1120, amino ethyl amino propyltrimethoxysilane, Union Carbide A-174, methacryloxypropyltrimethoxy silane, and Union Carbide A-187, glycidoxypropyltrimethoxy silane.

To silanize a typical substrate with surface hydroxyl groups, wash the substrate, preferably a plate of glass, in a first solution prepared from 4 drops of Basic H to 450 ml. distilled water. After washing, rinse the substrate in distilled water and then subject the substrate to a second solution consisting of a 1:1 ratio of $HNO_3:H_2O$. After application of the second solution, rinse the substrate with distilled water. Next, spin coat the substrate with a solution of about 2% (W/W) amino ethyl amino propyltrimethoxy silane in 95/5% (V/V) ethanol/water. After spin coating the substrate, bake the substrate in an air convection oven for 10 minutes at 110° C.

This silanization procedure just described can be modified for use in numerous types of manufacturing settings. The procedure can be modified wherein the silane is added to the rinse water tank of a commercial glass washer to achieve a solution of about 0.5% (V/V). The silane solution could then be replenished in accordance with the water refresh rate of about 5 gal. per hour.

This silanization procedure can be modified wherein a prewashed substrate can be sprayed with the first and second solution described above instead of washing, as a prelude to curtain coating or extrusion coating the film onto the substrate. The activation of the silane on the substrate, that is, the hydrolysis of methoxy groups and covalent bond formation to surface hydroxy groups, can be accomplished in the drying phase after spraying. Alternatively, covalent bonds can be developed between the silane coat and substrate during heat sealing or film lamination treatment.

The use of a silane coupling agent to bond hydrogenated and non-hydrogenated styrene-diene copolymers in a composition was disclosed in U.S. Pat. No. 4,296,008. In that reference, the silane improved the water resistance of the resultant sealant composition. Silane coupling agents are generally ambifunctional molecules with the unique ability to improve the bond between organic polymers and many mineral surfaces, and to retain composite properties after prolonged exposure to moisture. Silane coupling agents have not been used extensively in hot melt end use applications.

Chemically, silane coupling agents are hybrid materials that possess the dual functionality of an organic functional group at one end of the molecule and the hydrolyzable silanol functionality on the opposite end. Generally, all silane coupling agents can be represented by the formula $(RO)_3Si\ X$. In this formula, X represents a functional organic group such as chlorine, mercaptan, amines or diamines, epoxy, vinyl, or methacrylate. These reactive organic groups are attached through a stable carbon linkage, usually a $(CH_2)_3$ group, to the silicon. At the silicon or inorganic end of the molecule are hydrolyzable alkoxy or acetoxy groups (RO). These methoxy or acetoxy groups on silicon undergo rapid hydrolysis in aqueous solutions, or upon exposure to moist air to form the reactive SiOH (silanol) functionality. Thus, two quite different chemically reactive groups are at opposite ends of the same silane coupling agent molecule.

Once the silanization process is completed the extruded film can be coated onto the pretreated substrate. The combination of pretreated substrate and the coating of extruded film can be called the coated substrate.

Once the coated substrate is prepared, the procedure for making a solar cell assemblage can proceed, generally in the following manner:

(1) assembling the cell array;
(2) applying the cell array to the coated substrate;
(3) vacuum laminating the assemblage;
(4) heat sealing the assemblage; and
(5) treating the edges of the assemblage.

Vacuum lamination of the assemblage forming a pressure gradient between the substrate, and the film of step (3) above should occur wherein the pressure gradient is between about 1 and about 14.7 psi. Heating of the assemblage in the heat sealing step (4) above can occur at a temperature in the range of between about 23° C. and about 180° C.

Also, a series of solar strings can be placed consecutively on the coated substrate, without a string interconnect step. A second coated substrate can be placed, coating side down on the solar cell or solar cell string and vacuum laminated. Solar cell assemblages can be interconnected after lamination and the interconnection hardware can be molded into a frame in a subsequent polymer framing step. It is preferred that the polymer frame be a carbon filled material; thus a black polymer frame is most preferred, although aluminum, stainless steel, reinforced plastic and a metal capable of forming a rigid frame may also be used within the scope of this invention. The vacuum laminated array can then be framed in the traditional manner. A cover can be disposed on the encapsulated solar cell laminate. Such a cover can comprise a silicone, a poly-vinyl-fluoride, a polyester or a laminate of these materials and may further include an aluminum foil covering.

If this method of preparing solar cells is not followed, i.e. silanization of the substrate surface is not performed, then inadequate adhesion of the novel film to the glass under conditions of high humidity exposure can occur. One method for circumventing this problem involves forming of appropriate moisture barrier edge sealants around the edges of the laminated assemblage.

The further step of edge sealing can be accomplished using a polyester tape with silicone adhesive, such as the tape made by CHR of New Haven, CT. This particular tape can provide an adhesive strength of encapsulant to non-silanized AFG-Solite glass of about 20–29 lbs/in.

Figure 1:
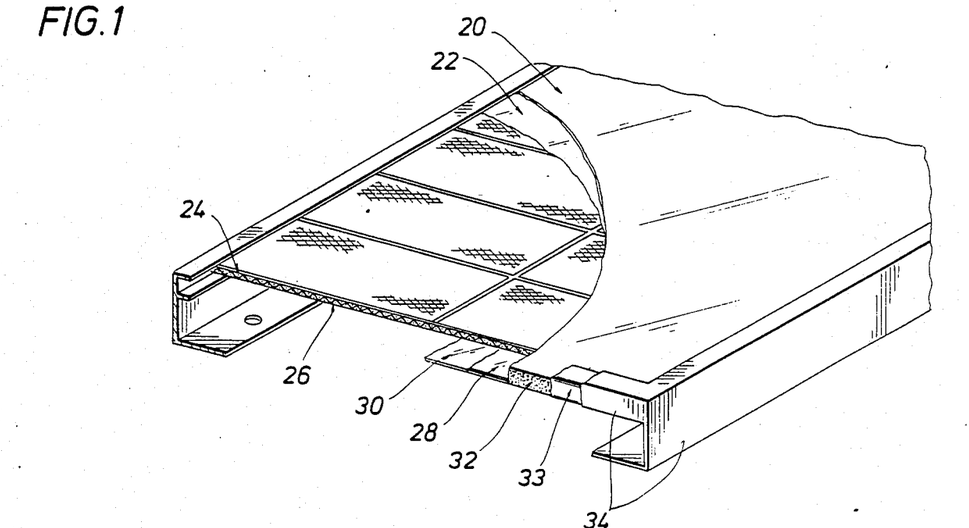
FIG. 1 is a typical solar cell assemblage which can be prepared in accordance with the present invention.

FIG. 1 illustrates a typical solar cell assemblage as prepared by this novel method. This representative module is constructed from a substrate (20), a first film (22), a layer of semiconductor material (24), solder mesh (26), a second film (28), a polymer or glass back (30), edge sealing (32), gasket (33), and frame (34). This representative module can be prepared with a first film (22) between 15–20 mils thick and a second film about 15–20 mils thick. Additionally edge sealant (32) can be a rubber type sealant. It is most preferred to use a butyl-type rubber sealant.

Figure 2:
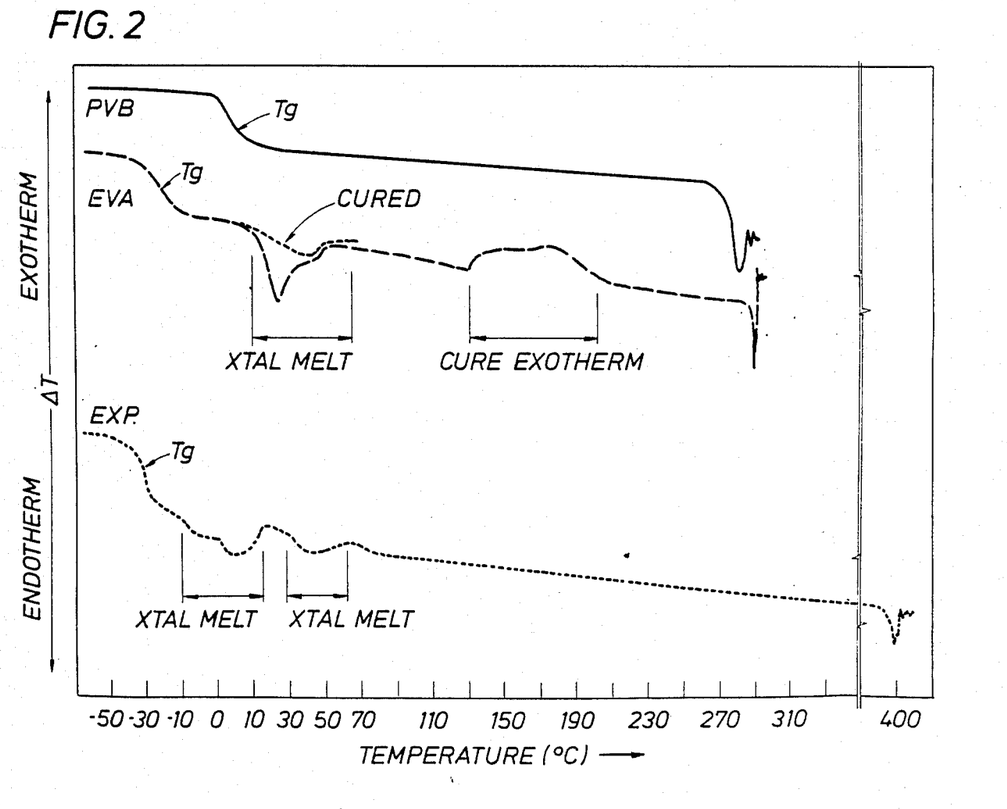
FIG. 2 is a graph which illustrates decomposition temperatures for three comparable elastomeric films laminated on glass: PVB, EVA, and the experimental film.

The novel encapsulant system comprising the substrate (20) and first film layer (22) in FIG. 1 can be compared with conventional encapsulant systems which use PVB or EVA which do not use either this silanization pretreatment process or the novel film composition. FIG. 2 is a graph which compares the characteristics of the novel encapsulant system (hereinafter denoted as EXP. Coating) and a PVB encapsulant system, (here Monsanto's Saflex SR-15 PVB) and an EVA system, (here Springborn's A-9918 EVA). FIG. 2 presents the thermal profiles for each of the three systems as assessed by differential scanning calorimetry performed in nitrogen ($N_2$). This technique shows whether the glass transition temperature (Tg), cure exotherm, and decomposition temperatures are compatible with lamination conditions and module service temperatures. As can be seen in FIG. 2, PVB has a relatively high Tg of 19° C. and a gradual softening endotherm to its decomposition temperature of 303° C. EVA has a $T_g$ of $-24°$ C. with two regions of crystal melt in the range 43°–60° C. EVA has a cure exotherm in the region 150°–220° C. and a softening endotherm to a decomposition temperature of 309° C. The Exp. coating on the other hand, has no cure exotherm. It has a $T_g$ of $-30°$ C., some region of melt endotherm, which may be related to crystallinity, and a gradual softening to a decomposition temperature of 400° C.

Figure 3:
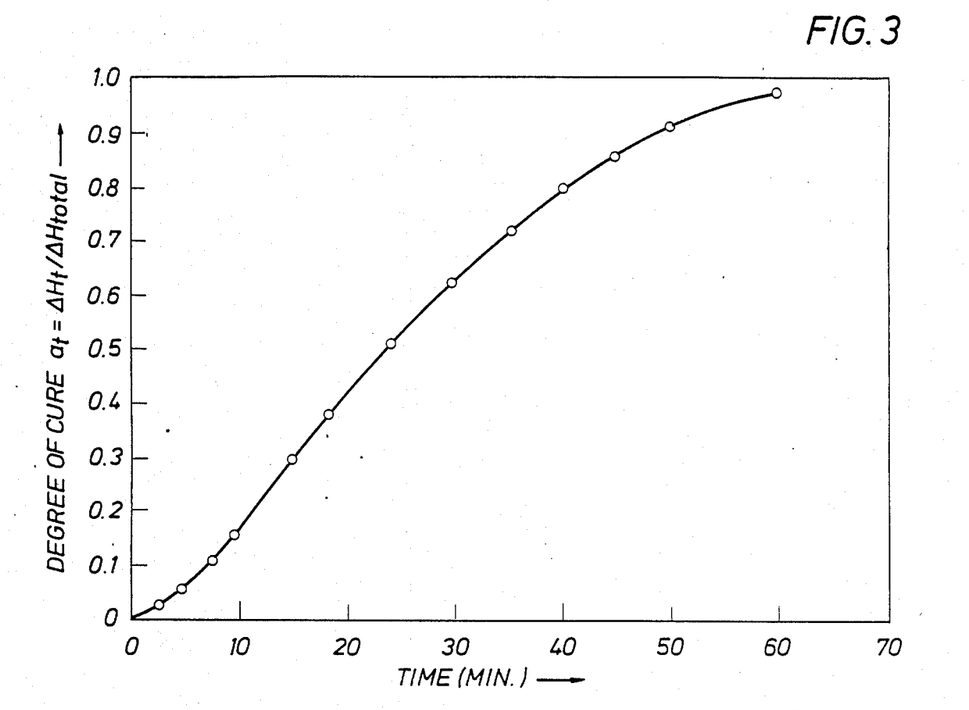
FIG. 3 is a graph illustrating the cure kinetics of EVA with an in-house lamination cycle time and temperature.

The kinetics of cure of this particular EVA were also measured by differential thermal analysis by comparing the $\Delta$ H at time t to the total $\Delta$ H exotherm at a given temperature. It was critical to determine if the cure kinetics of this EVA were compatible with a given lamination cycle time and temperature. The results obtained at 170° C. are presented in FIG. 3. Even at 170° C., the time to achieve 15% crosslinking, which is considered to be a minimum for satisfactory creep resistance, is 10 min. Also only 50% of unused peroxide can be removed by as long as a 12 hour evacuation.

Figure 4:
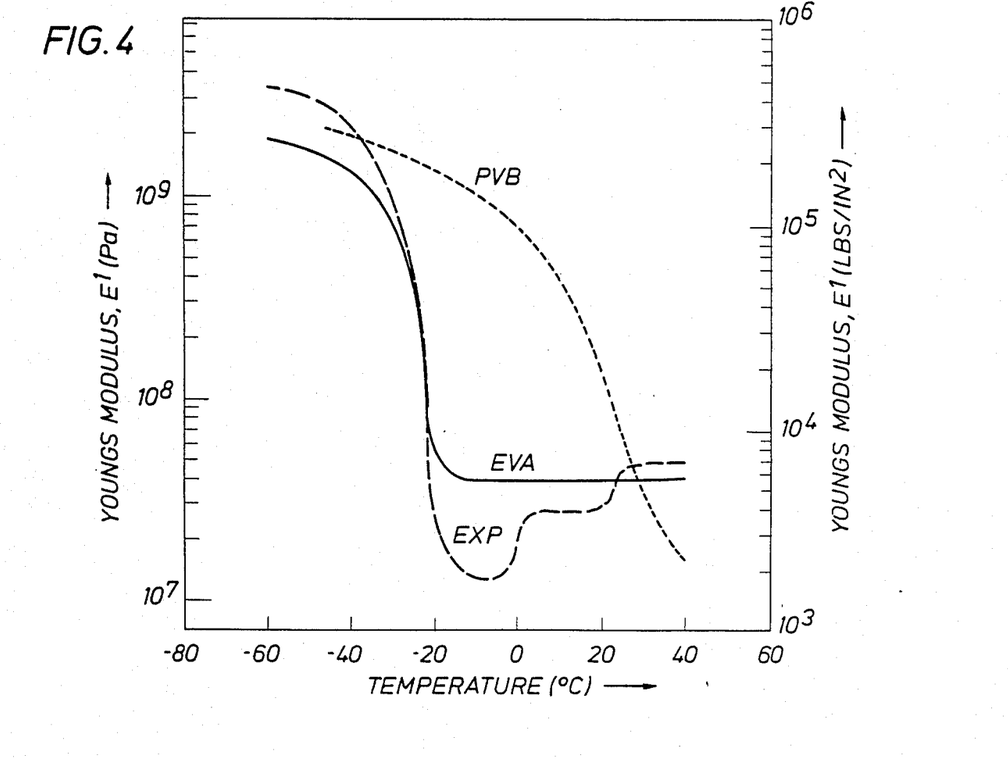
FIG. 4 is a graph which illustrates impact resistance of three elastomeric films: PVB, EVA, and the experimental film.
Figure 5:
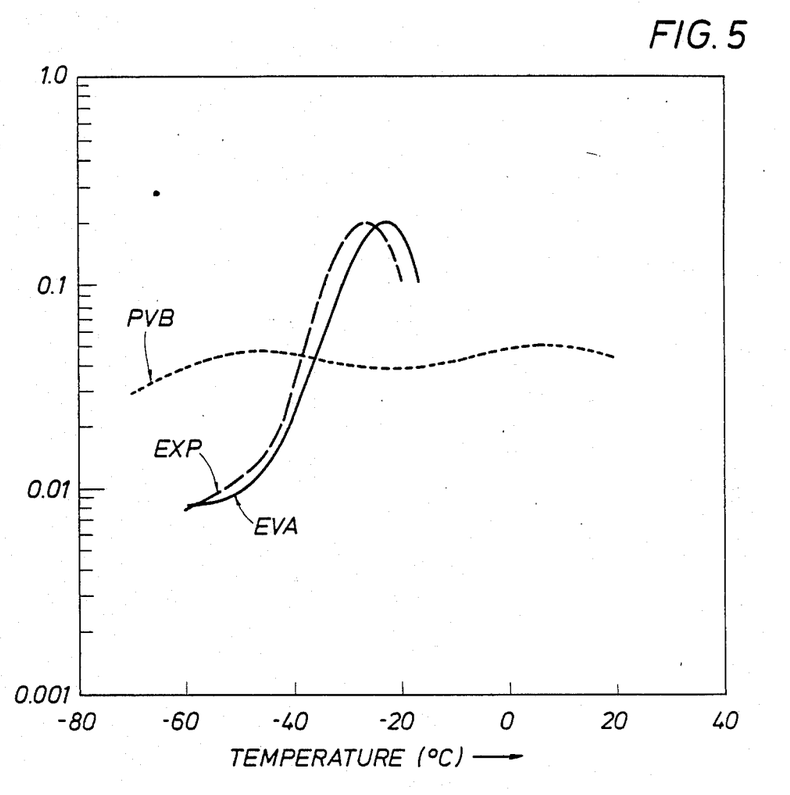
FIG. 5 is a graph which illustrates creep resistance of laminated PVB, EVA, and experimental film assemblies when heated at a rate of 5° C. per minute between −40° and 400° C. in an inert nitrogen atmosphere.

The determination of Young's modulus and tan δ as a function of temperature were made using dynamic mechanical analysis to ascertain whether impact resistance for each system was good in the module service temperature range (FIG. 4). Modulus (E') vs temperature for each of these same three systems is presented in FIG. 4. E' for PVB, EVA, and the Exp. coating at 0° C. was found to be $7.7 \times 10^8$, $4 \times 10^7$ and $1.5 \times 10^7$ Pa, respectively. The corresponding tan δ data is presented in FIG. 5. Both sets of data show that the Exp. coating system and this particular EVA system retain elastomeric properties at low temperature better than PVB and hence, provide better impact resistance at temperatures <0° C.

Creep resistance was indirectly measured by determining the penetration temperature of a quartz probe with a 1 gm load resting on the pottant sample. Each system was heated at a rate of 5° C./min between −40 and 400° C. in $N_2$. The data is presented in Table 2 below, and shows that creep resistance in EVA is a strong function of the degree of crosslinking in the rubber phase which consequently must be carefully controlled. Creep resistance in the Exp. coating can be varied by regulating the addition of the tackifying resin such as Regalrez 1094, or Arkon P85. Since the tackifying resin also promotes adhesion by reducing viscosity, a compromise between this property and creep resistance is well within the acceptable range for both parameters.

TABLE 2

| TMA PENETRATION TEMPERATURE | |
|---|---|
| Encapsulant | Temperature, °C. |
| PVB | 110 |
| EVA, 100% rubber phase of film-linked | no penetration to 250° C. |
| EVA, 52% rubber phase of film-linked | no penetration to 250° C. |
| EVA, 15% rubber phase of film-linked | 44 |
| EXP, 0% tackifying resin | 148 |
| EXP, 20% tackifying resin | 135 |
| EXP, 40% tackifying resin | 102 |
| EXP, 70% tackifying resin | 80 |

The adhesion of each system was determined by measuring the peel strength of 1" strips pulled from a substrate of glass with and without the described amino silane treatment. The PVB and EVA values were comparable at 25±5 lbs/in. when silanized glass was used for EVA. Silane promoted adhesion of the Exp. coating particularly for the formulation given in Table 1, wherein an adhesion of 30±3 lbs/in. was measured.

The reliability of each of these coatings as encapsulant candidates was assessed by measuring water absorption - permeation and oxidative and UV stability. Furthermore, the effect of thermal aging at 150° C. on light transmission at 435 nm was measured.

Water absorption was measured by weight gain following a 1 week water soak at 25° C. Only PVB had measurable water uptake which was 6.25%.

Water permeation was measured by ASTM E-96-66 and the results are presented in Table 3. The Exp. coating is an order of magnitude less water permeable than either PVB or EVA.

The oxidative stability of the three systems was measured by thermo gravimetric analysis performed in $O_2$ and the results are shown in Table 4.

TABLE 3

| WATER PERMEABILITY OF PVB, EVA, SSP | |
|---|---|
| | Permeability (metric perm. cm) |
| PVB | 3.76 ± .10 E-2 |
| EVA | 2.09 ± .04 E-2 |
| EXP | 0.27 ± .02 E-2 |

TABLE 4

| OXIDATIVE STABILITY | |
|---|---|
| | T decomposition °C. |
| PVB | 337 ± 16 |
| EVA | 234 ± 2 |

TABLE 4-continued

| OXIDATIVE STABILITY | |
|---|---|
| | T decomposition °C. |
| EXP | 352 ± 16 |

Figure 6:
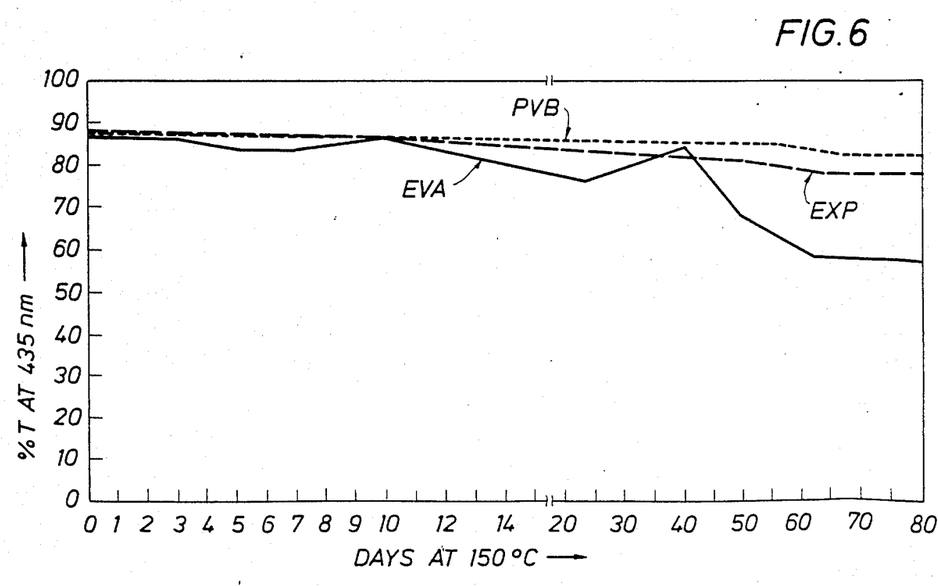
FIG. 6 is a graph which illustrates the oxidative stability of the three laminated systems wherein the experimental film laminate system has greater oxidative stability than the laminated PVB system or the laminated EVA system.

The order of decreasing oxidative stability is EXP>PVB>EVA. The effect of oxidative stability on light transmission at 435 nm for 30 mil samples encapsulated between two pieces of AFG Solite glass is presented in FIG. 6 as a function of 150° C. thermal aging. It is evident that discoloration is affecting transmission of EVA after approximately 50 days.

The UV stability of three encapsulant systems was measured by irradiating samples sandwiched between two NaCl plates. The UV source was a 350W Hg lamp with an irradiance at 365 m of 12 mW/cm$^2$. One set of samples was irradiated directly and a second set was irradiated with ⅛" thick, low iron, AFg solite glass intervening between source and sample. In the latter case no detectable IR changes were observed even after 976 hours of exposure. In the former case, IR - detectable changes were observed after 810 hours for all three encapsulant systems, although the results were most dramatic for PVB and EVA.

Figure 7:
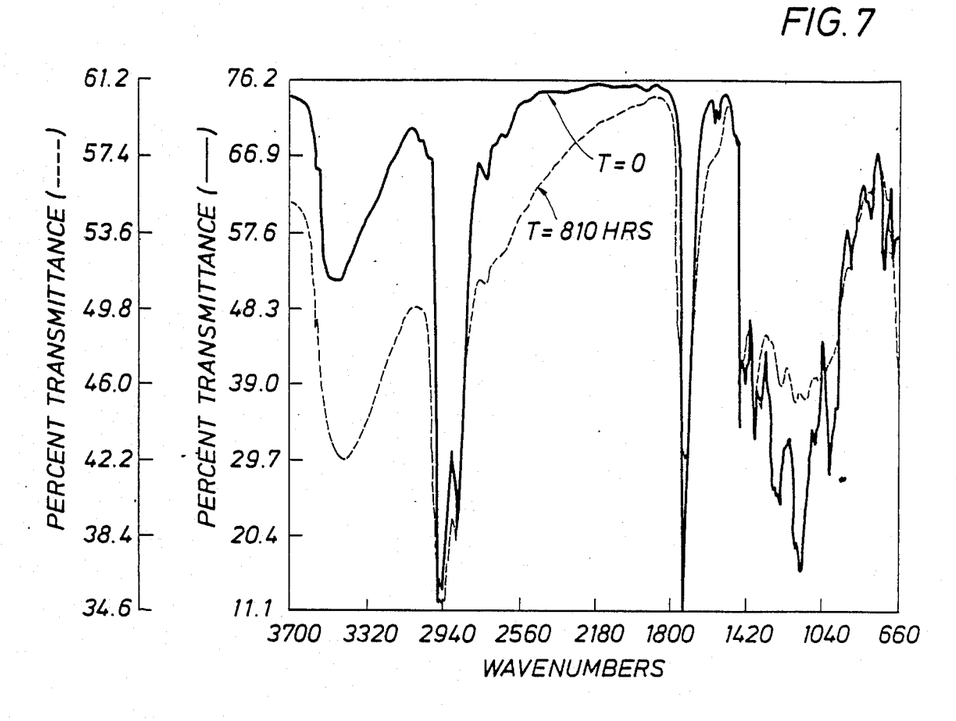
FIG. 7 illustrates the IR spectra of PVB at times zero and after 810 hours UV exposure.

FIG. 7 shows the IR spectra of PVB at time zero and after 810 hours of UV exposure. The most significant change is the loss of phthalate plasticizer as evidenced by the strong attenuation of the 1736, 1601, 1580, 1459, 1380, 1356, 1343, 1280-1285, 1138, 1073, 745 cm$^{-1}$ peaks. A second significant result is the formation of carboxylic acid seen from the broadening of the baseline from approximately 1780 to 3700 cm$^{-1}$ and the carboxylic hydroxyl at 3444 cm$^{-1}$. A likely explanation for the carboxylic development is the oxidation and hydrolysis of butyraldehyde to butyric acid leaving behind hydroxyls which could contribute to the 3444 cm$^{-1}$ peak. Absorbed water could also contribute to the 3444 cm$^{-1}$ peak and the 1603 cm$^{-1}$ peak.

Figure 8:
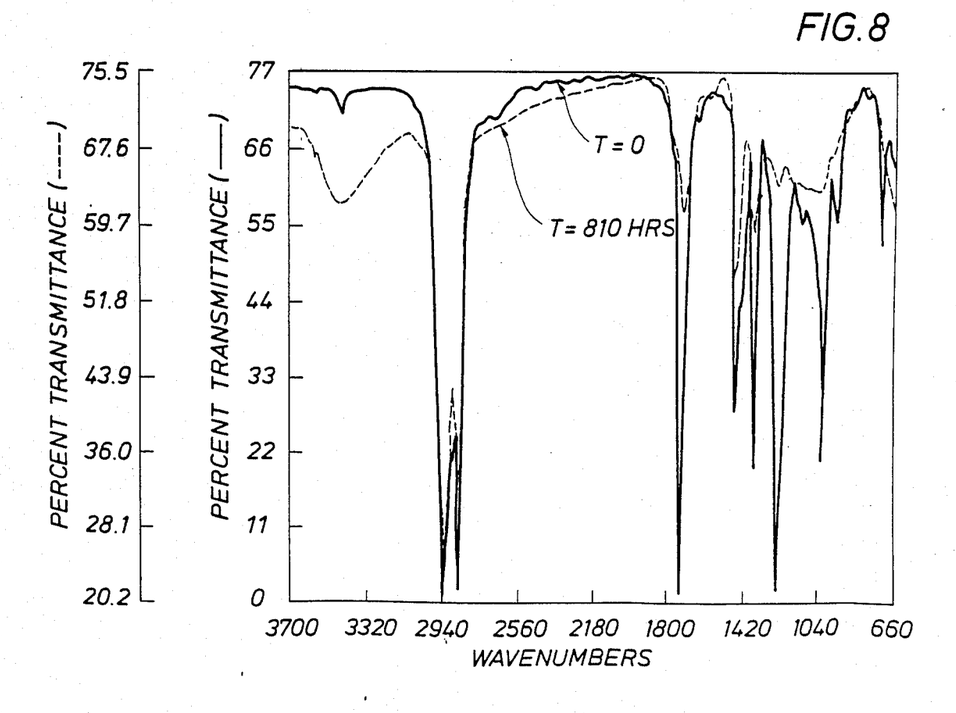
FIG. 8 illustrates the IR spectrum of EVA at times zero after 810 hours UV exposure.

FIG. 8 shows the IR spectra of EVA at time zero and after 810 hours of UV exposure. The significant change in this case is the loss of acetate as evidenced by the reduction of 1739, 1439, 1372, 1241, and 1021 cm$^{-1}$ peaks. Thus, it would appear that major hydrolysis of acetate is occurring to produce acetic acid. The 1767 cm$^{-1}$ shoulder is likely carboxylic acid carbonyl or perhaps vinyl acetate from polymer chain hydrolysis. The 3456 cm$^{-1}$ peak could be water and hydroxyl associated with carboxylic acid and/or vinyl alcohol resulting from main chain hydrolysis.

Figure 9:
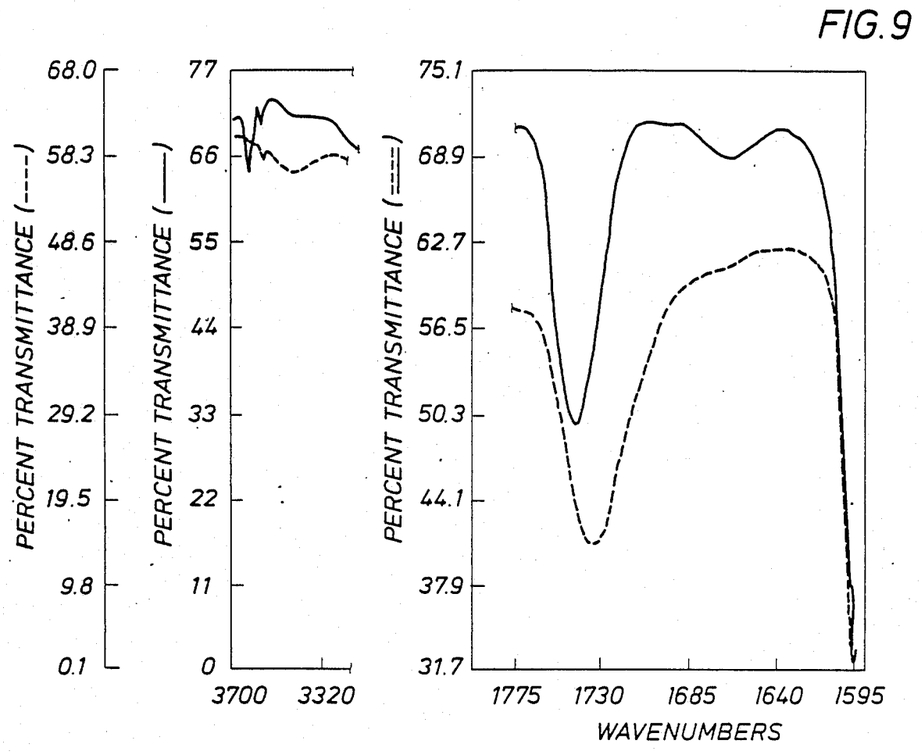
FIG. 9 is a partial IR spectrum of the experimental film at times zero and after 810 hours UV exposure.

FIG. 9 shows a blow-up of the only two regions of change in the spectrum of the EXP coating following 810 hours of UV exposure. There appears to be an increase in carbonyl at 1744 cm$^{-1}$ with a shift to 1735 cm$^{-1}$ and a broadening of the baseline. This could result from hydrolysis or mild oxidation. The second area of change is the increase in hydroxyl at approximately 3400 cm$^{-1}$. The overall change is consistent with the production of small quantities of carboxylic acid.

The IR - detectable changes occurring in PVB and EVA and, to a lesser extent in EXP are probably attributable to the short wavelength UV (<320 nm) normally absorbed by the glass in a photovoltaic panel. Nonetheless, the result shows EXP to be at least as UV stable, if not better, than either PVB or EVA for the accelerating conditions of UV exposure used.

The final property that was compared among the three candidates was the optical property of the light transmission in the UV, visible and near IR. Transmission as a function of wavelength is shown in FIG. 9 for 15 mil thick samples laminated in glass. The results show that the EXP coating has transmission comparable to EVA and both are slightly better than PVB.

Figure 10:
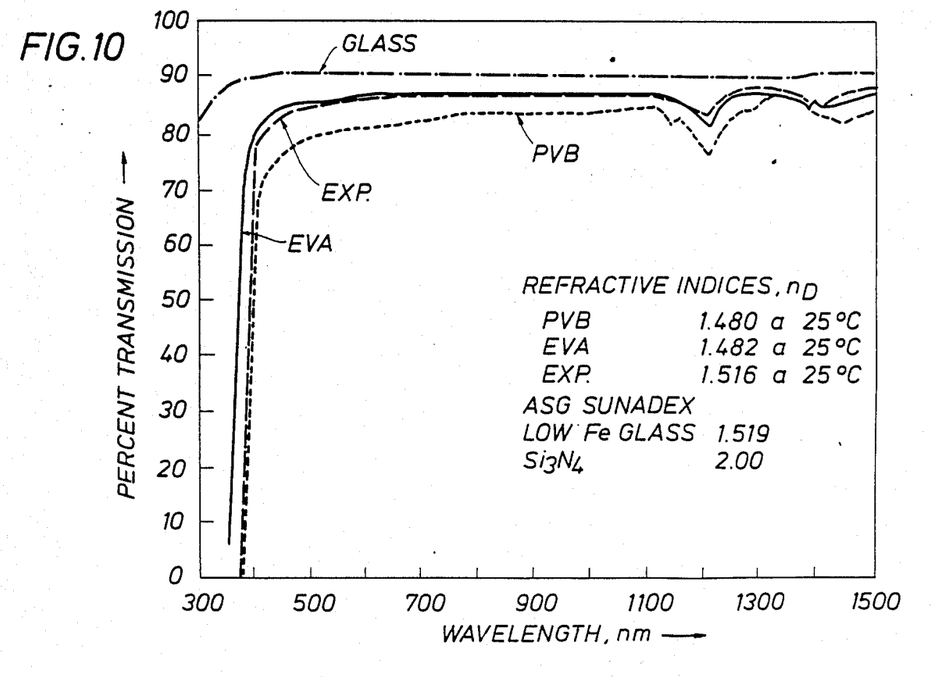
FIG. 10 is a graph which illustrates the percent of light transmission and UV stability versus wavelength for PVB, EVA, and experimental film laminate systems.

The literature refractive index values for PVB (2) and EVA (3) are also presented in FIG. 10. The measured value of EXP coating is 1.516, which is slightly higher and better matched to silicon nitride anti-reflective coatings than either EVA or PVB.

The novel and unobvious Experimental Coating is like PVB in that it does require cure. Unlike PVB, it does not have storage and handling properties related to water absorption. Its adhesion to glass is, however, sensitive to chemical formulation and film preparation techniques, both of which have been developed to insure a reliable, viable alternative to PVB or EVA for encapsulant or laminate systems.

What is claimed is:

1. A solar cell assemblage comprising:
   (a) a pre-treated silanized transparent substrate;
   (b) a layer of semiconductor material comprising at least one solar cell;
   (c) an electrical contact on the surface of said layer of semiconductor material;
   (e) an extruded transparent film for encapsulating the assemblage comprising (a), (b) and (c), said film comprising about 75 to about 91 parts by weight of a blend of:
   about 65 to about 75 parts by weight of a selectively hydrogenated two-block polymer wherein one polymer block is designated by A and a second polymer block is designated by B such that prior to hydrogenation,
      (1) each A is a polymer block of a monovinyl or alpha alkyl monovinyl arene having a number average molecular weight in the range of from about 5,000 to about 75,000, said A blocks comprising from about 10 to about 40% by weight of the total block copolymer, and
      (2) each B is a polymer block having a number average molecular weight in the range of from about 10,000 to about 150,000 and is formed by polymerizing a conjugated diene having from 4 to 10 carbon atoms per molecule, and said B blocks comprising from about 90 to about 60% weight of the total block copolymer, and
   about 25 to about 35 parts by weight of a selectively hydrogenated multiblock copolymer which contains at least two kinds of polymer blocks wherein one polymer block is designated by A and a second polymer block is designated by B such that:
      (1) each A is a polymer endblock of a monovinyl or alpha alkyl monovinyl arene having a number average molecular weight in the range of from about 5,000 to about 75,000, said A blocks comprising from about 10 to about 40% by weight of the total block copolymer, and
      (2) each B is a polymer midblock having a number average molecular weight in the range of from about 10,000 to about 150,000 and is formed by polymerizing a conjugated diene having from 4 to 10 carbon atoms per molecule, and said B blocks comprising from about 90 to about 10% weight of the total block copolymer,
   about 8.5 to about 23.5 parts by weight of an (alpha) methyl styrene polymer tackifying resin; and about 0.5 to about 1.5 parts by weight of a mixture of a phenolic antioxidant, a UV absorber with benzotriazole functionality and a UV absorber with hindered amine functionality;
(f) a frame to contain said encapsulated solar cell laminate; and
(g) sealant to seal the frame to the solar cell laminate.

2. The solar cell assemblage of claim 1, further comprising a cover disposed on said encapsulated solar cell laminate.

3. The solar cell assemblage of claim 2, wherein said cover comprises a member of the group consisting of a silicone, a polyvinylfluoride, a polyester or a laminate of such materials.

4. The solar cell assemblage of claim 3, wherein said cover further comprises an aluminum foil covering.

5. The solar cell assemblage of claim 1, wherein said substrate is a member of the group consisting of:
glass, polymethylmethacrylate, polyvinylfluoride, and polycarbonate.

6. The solar cell assemblage of claim 1, wherein said frame comprises a member of the group comprising: a carbon filled polymer, aluminum, stainless steel, reinforced plastic, and a metal capable of forming a rigid frame.

7. The solar cell assemblage of claim 1, wherein said extruded transparent film comprises about 78.5 to about 89.5 parts by weight of said blend, 10–20 parts by weight of said tackifying resin, 0.1 to 1.5 parts by weight of said mixture of a phenolic antioxidant, a UV absorber with benzotriazole functionality, and a UV absorber with hindered amine functionality.

8. The solar cell assemblage of claim 1, further comprising a second thin extruded transparent film consisting essentially of the same blend composition as the first film disposed on the electrical contact.

9. The solar cell assemblage of claim 8, wherein the second film is between about 15 and about 20 mils thick.

10. The solar cell assemblage of claim 1, wherein the first film is between about 15 and 20 mils thick.

11. The solar cell assemblage of claim 1 wherein the sealant is a rubber-type sealant.

12. The assemblage of claim 11, wherein the sealant is a butyl rubber-type sealant.

13. A method for making a solar cell assemblage comprising:
(a) silanizing a transparent substrate thereby forming a silanized substrate;
(b) extrusion coating one side of said silanized substrate with a first thin extruded transparent film, thereby forming a coated substrate, said first film consisting essentially of:
(1) about 78.5 to about 89.5 parts by weight of a blend of:
(a) about 65 to about 75 parts by weight of a selectively hydrogenated two-block polymer wherein one polymer block is designated by A and a second polymer block is designated by B such that prior to hydrogenation,
(1) each A is a polymer block of a monovinyl or alpha alkyl monovinyl arene having a number average molecular weight in the range of from about 5,000 to about 75,000, said A blocks comprising from about 10 to about 40% by weight of the total block copolymer, and
(2) each B is a polymer block having a number average molecular weight in the range of from about 10,000 to about 150,000 and is formed by polymerizing a conjugated diene having from 4 to 10 carbon atoms per molecule, and said B blocks comprising from about 90 to about 60% weight of the total block copolymer, and
(b) about 25 to about 35 parts by weight of a selectively hydrogenated multiblock copolymer which contains at least two kinds of polymer blocks wherein one polymer block is designated by A and a second polymer block is designated by B such that:
(1) each A is a polymer endblock of a monovinyl or alpha alkyl monovinyl arene having a number average molecular weight in the range of from about 5,000 to about 75,000, said A blocks comprising from about 10 to about 40% by weight of the total block copolymer, and
(2) each B is a polymer midblock having a number average molecular weight in the range of from about 10,000 to about 150,000 and is formed by polymerizing a conjugated diene having from 4 to 10 carbon atoms per molecule, and said B blocks comprising from about 90 to about 10% weight of the total block copolymer, and
(2) about 10 to about 20 parts by weight of a hydrogenated (alpha)-methyl styrene polymer resin;
(3) about 0.5 to about 1.5 parts by weight of a phenolic antioxidant, a UV absorber with benzotriazole functionality, and a UV absorber with hindered amine functionality;
(c) extrusion coating a backskin on the other side of said silanized substrate;
(d) disposing on said coated substrate a layer of semiconductor material comprising at least one solar cell;
(e) disposing an electrical contact on the surface of said semiconductor material;
(f) coating said electrical contact with a second thin extruded coherent film consisting essentially of the same blend composition as the first film and forming an assemblage;
(g) disposing a cover on said assemblage;
(h) applying a vacuum to the assemblage thereby forming a pressure gradient between said substrate and said film and therby vacuum laminating the assemblage;
(i) heating said vacuum laminated assemblage to a temperature greater than the softening point of said first and second films and less than the melting point of solder and thereby heat sealing said assemblage;
(j) disposing said heat sealed assemblage in a frame; and
(k) sealing said frame with an essentially rubber-type sealant and thereby forming a durable solar cell array.

14. The method of claim 13, wherein said assemblage is heated to a temperature in the range of about 23° C. to about 180° C.

15. The method of claim 13, wherein said pressure gradient is in the range between about 1 and about 14.7 psi.

16. The method of claim 13, wherein said rubber-tpe sealant used in step (k) is essentially a butyl rubber sealant.

17. The method of claim 13, wherein the first film disposed on said substrate is between about 15 and about 20 mils thick.

18. The method of claim 13, wherein said second film disposed on said electrical contact is between about 15 and about 20 mils thick.

19. A method for making a solar cell assemblage comprising:
   (a) silanizing a transparent substrate thereby forming a silanized substrate;
   (b) extrusion coating one side of said silanized substrate with a thin extruded transparent film, thereby forming a coated substrate, said film consisting essentially of:
      (1) about 78.5 to about 89.5 parts by weight of a blend of:
         (a) about 65 to about 75 parts by weight of a selectively hydrogenated two-block polymer wherein one polymer block is designated by A and a second polymer block is designated by B such that prior to hydrogenation,
            (1) each A is a polymer block of a monovinyl or alpha alkyl monovinyl arene having a number average molecular weight in the range of from about 5,000 to about 75,000, said A blocks comprising from about 10 to about 40% by weight of the total block copolymer, and
            (2) each B is a polymer block having a number average molecular weight in the range of from about 10,000 to about 150,000 and is formed by polymerizing a conjugated diene having from 4 to 10 carbon atoms per molecule, and said B blocks comprising from about 90 to about 60% weight of the total block copolymer, and
         (b) about 25 to about 35 parts by weight of a selectively hydrogenated multiblock copolymer which contains at least two kinds of polymer blocks wherein one polymer block is designated by A and a second polymer block is designated by B such that:
            (1) each A is a polymer endblock of a monovinyl or alpha alkyl monovinyl arene having a number average molecular weight in the range of from about 5,000 to about 75,000, said A blocks comprising from about 10 to about 40% by weight of the total block copolymer, and
            (2) each B is a polymer midblock having a number average molecular weight in the range of from about 10,000 to about 150,000 and is formed by polymerizing a conjugated diene having from 4 to 10 carbon atoms per molecule, and said B blocks comprising from about 90 to about 10% weight of the total block copolymer, and
      (2) about 10 to about 20 parts by weight of a hydrogenated (alpha)-methyl styrene polymer resin;
      (3) about 0.5 to about 1.5 parts by weight of a phenolic antioxidant, a UV absorber with benzotriazole functionality, and a UV absorber with hindered amine functionality;
   (c) extrusion coating a backskin on the other side of said silanized substrate;
   (d) disposing on said coated substrate a layer of semiconductor material comprising at least one solar cell;
   (e) disposing an electrical contact on the surface of said semiconductor material;
   (f) applying a vacuum to the assemblage thereby forming a pressure gradient between said substrate and said film, and thereby vacuum laminating the assemblage;
   (g) heating said vacuum laminated assemblage to a temperature greater than the softening point of said film and less than the melting point of solder and thereby heat sealing said assemblage;
   (h) disposing said heat sealed assemblage in a frame; and
   (i) sealing said frame with an essentially rubber-type sealant and thereby forming a durable solar cell array.

20. The method of claim 19, wherein said assemblage is heated to a temperature in the range of about 23° C. to about 180° C.

21. The method of claim 19, wherein said pressure gradient is in the range between about 1 and about 14.7 psi.

22. The method of claim 19, wherein said rubber-type sealant used in step (k) is essentially a butyl rubber sealant.

23. The method of claim 19, wherein said extruded transparent film disposed on said substrate is between about 15 and about 20 mils thick.

24. The method of claim 19, wherein said frame comprises a member of the group comprising:
   aluminum, stainless steel, carbon filled polymer, reinforced plastic and a metal capable of forming a rigid frame.

25. The method of claim 19, further comprising the step of disposing a cover on the assemblage prior to vacuum laminating said assemblage.

26. The method of claim 25, wherein said cover comprises a member of the group consisting of a silicone, a polyvinylfluoride, a polyester or a laminate of such materials, and an aluminum foil.

27. The method of claim 19, wherein said substrate is a member of the group consisting of:
   glass, polymethylmethacrylate, polyvinylfluoride, and polycarbonate.

28. The method of claim 19, wherein said extruded transparent film comprises about 78.5 to about 89.5 parts by weight of said blend, 10–20 parts by weight of said tackifying resin, 0.1 to 1.5 parts by weight of said mixture of a phenolic antioxidant, a UV absorber with benzotriazole functionality, and a UV absorber with hindered amine functionality.

* * * * *